United States Patent [19]

Rath et al.

[11] 4,111,742

[45] Sep. 5, 1978

[54] PROCESS FOR PRODUCING CRUCIBLE-DRAWN SILICON RODS CONTAINING VOLATILE DOPING AGENTS

[75] Inventors: Heinz-Jörg Rath; Dietrich Schmidt, both of Burghausen; Werner Zulehner, Emmerting, all of Fed. Rep. of Germany

[73] Assignee: Wacker-Chemitronic Gesellschaft für Elektronik-Grundstoffe mbH, Burghausen, Fed. Rep. of Germany

[21] Appl. No.: 811,047

[22] Filed: Jun. 29, 1977

[30] Foreign Application Priority Data

Sep. 2, 1976 [DE] Fed. Rep. of Germany ....... 2639563

[51] Int. Cl.$^2$ ............................................. B01J 17/18
[52] U.S. Cl. ............................... 156/617 SP; 422/249; 156/605; 156/624
[58] Field of Search ..................... 23/273 SP; 156/605, 156/617 R, 617 SP, 624

[56] References Cited

U.S. PATENT DOCUMENTS 3,627,499  12/1971   Marc Le Dul ................. 156/617 SP

FOREIGN PATENT DOCUMENTS 94,593   9/1969   France ............................... 156/617 SP
1,291,322   3/1969   Fed. Rep. of Germany ........... 156/605
197,216   7/1965   Sweden ................................ 23/273 SP Primary Examiner—Ronald H. Smith
Assistant Examiner—Sam Silverberg
Attorney, Agent, or Firm—Allison C. Collard

[57] ABSTRACT

A process for making crucible-drawn silicon rods containing volatile doping agents, especially antimony, said rods having narrow resistance tolerances, which comprises drawing from a pre-doped silicon melt a monocrystalline rod while passing through the melt a current of inert gas either intermittently or continuously.

6 Claims, No Drawings

PROCESS FOR PRODUCING CRUCIBLE-DRAWN SILICON RODS CONTAINING VOLATILE DOPING AGENTS

The invention relates to a process of producing crucible-drawn silicon rods containing volatile doping agents, especially antimony, within narrow resistance tolerances.

Monycrystalline silicon rods drawn e.g. from antimony-doped silicon melts according to a crucible drawing process, such as the known Czochralski process, exhibit generally a strong axial resistance gradient. Antimony becomes enriched in the decreasing melt due to its distribution coefficient to 0.023 in silicon so that much less antimony is incorporated at the beginning of the rod than at its end. Thus, when the rod is sawed into pieces, substrate discs are obtained having various concentrations of doping agent, differing therefore in ohmic resistance. However, the producers of building elements need substrate discs, having within certain tolerances, a concentration of doping agents as equal as possible, in order to make structural elements of equal or almost equal properties. As a consequence, a large amount of such crucible drawn silicon rods have to be discarded as waste.

The problem has been solved according to German patent No. 15 44 292 by immersing a seed crystal in the melt and adjusting the pressure of 10 torr, which is lowered during the drawing process to 3 torr. However, that process needs a container which is equipped with a comparatively expensive device for regulating reduced pressure.

It is the object of the present invention to provide a process for producing crucible-drawn silicon rods containing volatile doping agents with narrow tolerances in a simpler and more economic manner.

According to the invention, the object can be achieved by passing during the crystal-drawing an inert gas current through the silicon melt, appropriately doped, this passage being performed either intermittently or continuously.

In the following, the process according to the invention is illustrated by describing the production of silicon rods doped evenly over the entire length with antimony at narrow tolerances; this is the preferred mode of procedure. However, the process also lends itself to the production of phosphorus or arsenic doped silicon.

In a conventional crucible drawing apparatus, a batch of polycrystalline silicon pre-doped with antimony is melted in a quartz crucible in the known manner under a protective gas, e.g. argon. Into the melt, which has been heated up to about 1410°–1550° C., a seed crystal is immersed and, while rotating, a monocrystalline silicon rod is drawn from the melt. The drawing is discontinued, when, for instance, one third of the possible length of the rod is reached. Subsequently, a gas-admission tube is immersed into the silicon melt, consisting e.g. of quartz, preferably extending down to the bottom of the crucible. At the bottom end of the admission tube, a glass frit or a sieve plate having a pore width of preferably 0.1 to 0.5 mm, is provided, through which an inert gas, especially argon is passed with a through-flow rate of 1–4000 norm liters per hour, preferably 50–1000 liters, for 1 to 3 hours; the total quantity of gas passed through depends on the quantity of the melt and on the doping agent concentration. Instead of argon, other inert gases, e.g. helium or hydrogen may be passed through the melt. In this manner, the concentration of the dopant, which has increased in the melt due to segregation, will again be lowered. It is desirable to heat the inert gas to avoid a partial cooling down of the melt at the place where the gas enters. The gas can be heated e.g. by using a double-walled quartz tube, which is coated with carbon in its jacket and can, therefore, be heated inductively. Another, vary advantageous mode of operation, is the use of a spiral tube in the drawing space, whereby the gas is heated by means of the heat radiated off the melt surface.

The pressure adjusted in the drawing space is preferably about 0.8–1.5 bar, whereas it may be further reduced when dopants are used which are less volatile then antimony, such as phosphorus and especially arsenic. Pressure conditions may be maintained in general within wide limits conventional with the use of dopants, that is, between high vacuum and simple super pressure, thus between $10^{-6}$ to 5 bar. The adjustment may be made to maintain the pressure substantially over the entire drawing process, although fluctuations above or below the indicated values do not jeopardize the success of the process, which makes in accurate pressure regulating device unnecessary.

After the "gas blowing", another third of the silicon rod can be drawn from the remaining melt, this part of the rod exhibiting the same ohmic resistance values as the first piece, if the gas blowing is carried out over such a period and in such an amount that the antimony content of the melt is reduced to the starting amount in the melt. In order to provide a monocrystalline and dislocation free growth of the second piece of the rod, the end of the first formed piece is drawn together and a cylindrical end of small diameter is formed which corresponds to the usual seed crystal. The second piece of the rod is attached in the conventional manner to the end having the form of a seed crystal.

Depending on the desired resistance tolerance, the described process can be repeated as often as necessary. Furthermore, it is possible to pass inert gas continuously through the melt during the entire drawing process and thereby remove the excess amount of dopant accumulating in the melt due to segregation. The necessary amounts of gas and the through-flow rate can be determined either empirically by simply preliminary tests, or they can be calculated with the aid of the evaporation coefficients.

COMPARISON EXAMPLE. (without gas introduction)

500 g silicon with a dopant content of $9.35 \times 10^{16}$ atoms antimony per gram of silicon are melted under argon at normal pressure in a conventional drawing apparatus. A monocrystalline silicon rod was then drawn by immersing a seed crystal attached to the bottom end of a drawing shaft into the surface of the silicon melt heated to 1440° C.; the pressure was 1 bar, the drawing rate 2 mm per minute, and the rotation of the shaft around the longitudinal axis was 15 revolutions per minute. 284 g of melt remained in the crucible. The usable cylindrical piece of rod was 18 cm long and had a diameter of 25 mm, the mean specific resistance being 0.83 ohm cm, $n$, with the starting value after 2 cm drawing length being 1.01 ohm cm, $n$, the final value, after 16 cm drawing length, 0.65 ohm cm, $n$.

EXAMPLE (according to the invention)

500 g silicon with a dopant content of $9.35 \times 10^{16}$ atoms per gram of silicon were melted under argon, as described in the comparison example, at a pressure of 1 bar; the drawing rate and the rpm were also the same. The crystal was drawn from a melt having the temperature of 1440° C. After a drawing length of 9 cm, measured in the cylindrical portion after the cone formation, the rod is drawn together to the diameter of a conventional seed crystal and the drawing process is interrupted. A gas admission tube of quartz equipped with a quartz frit having a pore width of 0.3 mm is introduced into the crucible down to the bottom of the crucible and a preheated current of argon is passed into the melt. The preheating of the argon is effected by conducting the tube in parallel to the melt surface for about 8 cm at a distance of about 1 cm, the tube being only then dipped into the melt. This quarantees the preheating of the argon current and prevents crystallization of the melt. Argon is passed into the melt for two hours at a through-flow rate of 100 N liter Argon per hour.

After the termination of the gas flowing, the quartz tube is taken out, the end is formed to the width of a seed crystal and a second piece of monocrystalline, dislocation-free rod attached and drawn. After 10 cm drawing length, measured in the cylindrical portion after cone formation, the crystal growth is discontinued, and after having taken out the rod its specific resistance is measured in axial direction.

The starting value after 2 cm drawing length is 1.01 ohm cm, n. The value after 8 cm drawing length, that is before introduction of gas is 0.87 ohm cm, n. The value after 10 cm drawing length, i.e. immediately after gas blowing, is 1.01 ohm cm n, and after 16 cm drawing length 0.81 cm, n.

These resistance values compared with the ones obtained without gas blowing, clearly show the advantage obtained by the process of the invention.

From the foregoing description, one skilled in the art can easily ascertain the essential characteristics of this invention, and without departing from the spirit and scope of the invention thereof, can make various changes and modifications of the invention to adapt it to various usages and conditions. Consequently, such changes and modifications are properly, equitably and intended to be, within the full range of equivalence of the following claims.

What is claimed is:

1. A process for making crucible drawn silicon rods containing volatile doping agents, said rods having narrow resistance tolerances, which comprises melting a pre-doped polycrystalline silicon batch in a crucible under argon, immersing a seed crystal into the melt and drawing a monocrystalline rod from the melt while introducing during the drawing process a current of inert gas at the bottom of the crucible, and passing it through the melt at least for a part of the drawing operation.

2. The process according to claim 1, wherein the melt is heated up to 1410°–1550° C. during the crystal drawing.

3. The process according to claim 1 wherein a pressure of 0.8–1.5 bar is adjusted in the drawing space.

4. The process according to claim 1 wherein argon is the gas passed through the melt during the drawing process.

5. The process according to claim 1, wherein the gas introduced into the melt is preheated to prevent crystallization of the melt at the point of introduction.

6. The process according to claim 1 wherein the passage of inert gas through the melt of 500 g Si is effected during about 1 to 3 hours with a rate of flow of about 50–1000 N liter per hour.

* * * * *